(12) United States Patent
Franceschini et al.

(10) Patent No.: US 8,624,217 B2
(45) Date of Patent: Jan. 7, 2014

(54) PLANAR PHASE-CHANGE MEMORY CELL WITH PARALLEL ELECTRICAL PATHS

(75) Inventors: Michele M. Franceschini, White Plains, NY (US); John P. Karidis, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 404 days.

(21) Appl. No.: 12/823,924

(22) Filed: Jun. 25, 2010

(65) Prior Publication Data

US 2011/0317481 A1 Dec. 29, 2011

(51) Int. Cl.
*H01L 29/06* (2006.01)
*G11C 11/00* (2006.01)

(52) U.S. Cl.
USPC ..... 257/4; 257/2; 257/3; 257/5; 257/E29.006; 365/148; 365/163

(58) Field of Classification Search
USPC ........... 257/2–5, E29.002–E29.006; 365/148, 365/163
See application file for complete search history.

(56) References Cited

U.S. PATENT DOCUMENTS

| | | | |
|---|---|---|---|
| 3,207,061 A | 9/1965 | Zaromb et al. | |
| 3,494,803 A | 2/1970 | Avis et al. | |
| 6,087,674 A | 7/2000 | Ovshinsky et al. | |
| 6,507,061 B1 | 1/2003 | Hudgens et al. | |
| 7,107,276 B2 | 9/2006 | Johnson, Jr. | |
| 7,254,059 B2 | 8/2007 | Li et al. | |
| 7,272,037 B2 * | 9/2007 | Lee et al. | 365/163 |
| 7,351,992 B2 | 4/2008 | Scheuerlein | |
| 7,411,818 B1 | 8/2008 | Elmegreen et al. | |
| 7,473,921 B2 | 1/2009 | Lam et al. | |
| 7,514,705 B2 | 4/2009 | Breitwisch et al. | |
| 7,518,212 B2 | 4/2009 | Moore et al. | |
| 7,608,848 B2 | 10/2009 | Ho et al. | |
| 7,701,750 B2 | 4/2010 | Shih et al. | |
| 7,718,988 B2 | 5/2010 | Lee | |
| 7,781,269 B2 | 8/2010 | Wang et al. | |
| 7,881,089 B2 | 2/2011 | Franceschini et al. | |
| 7,929,338 B2 | 4/2011 | Franceschini et al. | |
| 7,977,674 B2 | 7/2011 | Yoon et al. | |
| 7,989,796 B2 | 8/2011 | Lam et al. | |
| 8,098,517 B2 | 1/2012 | Kostylev | |
| 8,124,968 B2 | 2/2012 | Koo et al. | |
| 8,144,508 B2 | 3/2012 | Franceschini et al. | |
| 8,159,857 B2 | 4/2012 | Gammel et al. | |
| 8,263,317 B2 | 9/2012 | Fargeix et al. | |

(Continued)

OTHER PUBLICATIONS

International Search Report for International Application No. PCT/EP2011/060595 mailed Sep. 29, 2011.

(Continued)

*Primary Examiner* — Allison P Bernstein
(74) *Attorney, Agent, or Firm* — Cantor Colburn LLP

(57) ABSTRACT

A planar phase change memory cell with parallel electrical paths. The memory cell includes a first conductive electrode region having a length greater than its width and an axis aligned with the length. The memory cell also includes a second conductive electrode region having an edge oriented at an angle to the axis of the first conductive electrode region. The memory cell further includes an insulator region providing a lateral separation distance between an end of the first conductive electrode region and the edge of the second conductive electrode region, the insulator region including at least part of an insulator film and the lateral separation distance is responsive to the thickness of the insulator film.

5 Claims, 17 Drawing Sheets

(56) References Cited

U.S. PATENT DOCUMENTS

| | | |
|---|---|---|
| 2004/0175804 A1 | 9/2004 | Skonezny et al. |
| 2007/0096090 A1 | 5/2007 | Dennison |
| 2007/0246748 A1 | 10/2007 | Breitwisch et al. |
| 2007/0295948 A1 | 12/2007 | Lam et al. |
| 2008/0048213 A1 | 2/2008 | Liu |
| 2008/0048293 A1 | 2/2008 | Horii |
| 2008/0101109 A1 | 5/2008 | Haring-Bolivar et al. |
| 2008/0157051 A1 | 7/2008 | Lam et al. |
| 2008/0164452 A1 | 7/2008 | Joseph et al. |
| 2008/0186760 A1 | 8/2008 | Elmegreen et al. |
| 2008/0247224 A1 | 10/2008 | Lung |
| 2008/0285335 A1 | 11/2008 | Elmegreen et al. |
| 2009/0014770 A1 | 1/2009 | Terao et al. |
| 2009/0141546 A1 | 6/2009 | Kim et al. |
| 2009/0146128 A1 | 6/2009 | Lee et al. |
| 2009/0196091 A1 | 8/2009 | Kau et al. |
| 2010/0059477 A1 | 3/2010 | Fargeix et al. |
| 2010/0084624 A1 | 4/2010 | Lung et al. |
| 2010/0214811 A1 | 8/2010 | Franceschini et al. |
| 2010/0214829 A1 | 8/2010 | Franceschini et al. |
| 2010/0214830 A1 | 8/2010 | Franceschini et al. |
| 2010/0259962 A1 | 10/2010 | Yan et al. |
| 2011/0096594 A1 | 4/2011 | Franceschini et al. |
| 2011/0134676 A1 | 6/2011 | Breitwisch et al. |
| 2012/0049144 A1 | 3/2012 | Franceschini et al. |

OTHER PUBLICATIONS

Written Opinion for International Application No. PCT/EP2011/060595 mailed Sep. 29, 2011.

Daniele Ielmini et al.; "Recovery and Drift Dynamics of Resistance and Threshold Voltages in Phase-Change Memories"; IEEE Transactions on Electron Devices; vol. 54, No. 2; Feb. 2, 2007.

P. Haring Bolivar et al.; "Lateral Design for Phase Change Random Access Memory Cells with Low-Current Consumption"; Institute of Semiconductor Electronics, RWTH Aachen University Sommerfeldstr. 24, 52056 Aachem, Germany.

S. Raoux et al.; "Phase-Change Random Access Memory: A Scalable Technology"; IBM J. Res. & Dev. vol. 52 No. 4/5 Jul./Sep. 2008.

Ken 'ichiro Sonoda et al.; "A Compact Model of Phase Change Memory Based on Rate Equations of Crystallization and Amorphization"; IEEE Transactions on Electronic Devices; vol. 55, No. 7, Jul. 2008.

You Yin et al.; "Multilevel Storage in Lateral Top-Heater Phase-Change Memory"; IEEE Electron Device Letters, vol. 29, No. 8, Aug. 2008.

You Yin et al. "Programming Margin Enlargement by Material Engineering for Multilevel Storage in Phase-Change Memory"; Applied Physics Letters 95, 133503 (2009).

* cited by examiner

PLANAR PHASE-CHANGE MEMORY CELL WITH PARALLEL ELECTRICAL PATHS

BACKGROUND

This present invention relates generally to computer memory, and more specifically to phase change memories (PCMs).

A PCM is a form of resistive non-volatile computer random-access memory (RAM) that stores data by altering the state of the matter from which the device is fabricated. Phase change materials can be manipulated into two or more different phases or states, with each phase representing a different data value. Generally, each phase exhibits different electrical properties (or different resistance values). The amorphous and crystalline (or polycrystalline) phases are typically two phases used for binary data storage (1's and 0's) since they have detectable differences in electrical resistance. Specifically, the amorphous phase has a higher resistance than the crystalline phase.

Chalcogenides are a group of materials commonly utilized as phase change material. This group of materials contains a chalcogen (Periodic Table Group 16/VIA) and another element. Selenium (Se) and tellurium (Te) are the two most common elements in the group used to produce a chalcogenide semiconductor when creating a PCM memory cell. An example of this would be $Ge_2Sb_2Te_5$ (germanium-antimony-tellurium or "GST"), $SbTe_3$, and $In_2Se_3$.

Altering the phase change material's state can be achieved by heating the material to a melting point and then cooling the material to one of the possible states, or by heating an amorphous region to, or near, a crystallization temperature to convert some or all of the amorphous material to crystalline form. A current passed through the phase change material creates heat and causes the phase change material to melt. Melting and gradually cooling down the phase change material allows time for the phase change material to form the crystalline state. Melting and abruptly cooling the phase change material quenches the phase change material into the amorphous state. Heating to below the melting temperature can also be used to crystallize amorphous material without melting.

SUMMARY

An exemplary embodiment is an integrated electronic apparatus having a substantially planar surface. The integrated electronic apparatus including a first conductive electrode region having a length greater than its width and an axis aligned with the length. The apparatus also includes a second conductive electrode region having an edge oriented at an angle to the axis of the first conductive electrode. The apparatus further includes an insulator region providing a lateral separation distance between an end of the first conductive electrode region and the edge of the second conductive electrode region, the insulator region including at least part of an insulator film and the lateral separation distance is responsive to the thickness of the insulator.

An exemplary embodiment is a method for operating a phase change memory. The method includes initializing a memory cell that includes: a first conductive electrode having a length greater than its width and an axis aligned with the length; a second conductive electrode having an edge oriented at an angle to the axis of the first conductive electrode; an insulator providing a separation distance between an end of the first conductive electrode and the edge of the second conductive electrode; and a phase change material covering a substantial portion of the first conductive electrode and at least a portion of the second conductive electrode. The initializing the memory cell includes creating a first amorphous material region in the phase change material, the first amorphous material region covering a substantial area of the phase change material. An active crystalline material region is created inside the first amorphous material region by crystallizing a portion of the first amorphous material region. Information is stored in the memory cell by creating a second amorphous material region inside the active crystalline material region.

Another embodiment is a method of manufacturing a phase change memory cell on a substrate. The method includes: etching a first trench in the substrate; depositing a first conductor layer in the first trench; depositing a first insulator layer over the first conductor layer in the first trench; etching a second trench in the substrate at an angle to the first trench; depositing a second insulator layer in the second trench; depositing a second conductor layer over the second insulator layer in the second trench; and depositing phase change material. The deposited phase change material is in contact with the first conductor layer and the second conductor layer.

Another embodiment is a method for operating a phase change memory cell. The method includes changing the size of an amorphous material region in a phase change material using one or more electrical pulses. The phase change memory cell includes: a first conductive electrode having a length greater than its width and an axis aligned with the length; a second conductive electrode having an edge oriented at an angle to the axis of the first conductive electrode; an insulator providing a separation distance between an end of the first conductive electrode and the edge of the second conductive electrode; and the phase change material covering at least a portion of the first conductive electrode and the second conductive electrode.

A further embodiment is a design structure tangibly embodied in a machine readable medium for designing, manufacturing, or testing an integrated circuit. The design structure has a substantially planar surface. The design structure includes: a first conductive electrode region having a length greater than its width and an axis aligned with the length; a second conductive electrode region having an edge oriented at an angle to the axis of the first conductive electrode; and an insulator region providing a lateral separation distance between an end of the first conductive electrode region and the edge of the second conductive electrode region, the insulator region including at least part of an insulator film and the lateral separation distance is responsive to the thickness of the insulator film.

Additional features and advantages are realized through the techniques of the present embodiment. Other embodiments and aspects are described herein and are considered a part of the claimed invention. For a better understanding of the invention with the advantages and features, refer to the description and to the drawings.

BRIEF DESCRIPTION OF THE SEVERAL VIEWS OF THE DRAWINGS

The subject matter that is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Figure 1:
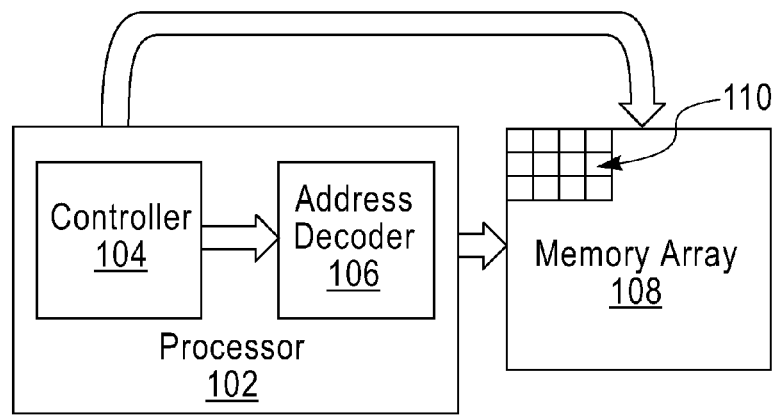
FIG. 1 illustrates a system programming a phase change memory (PCM) device in accordance with exemplary embodiments of the present invention.

Exemplary embodiments of the present invention are directed to a parallel-path memory cell structure that includes two electrodes contacting the same side of a deposited germanium-antimony-tellurium (GST) layer. In an exemplary embodiment, one electrode is a micro-trench (thus, having an exposed surface with a sublithographic dimension) and the second electrode (e.g., the bit line) is orthogonal to the first electrode and lays at a sublithographic distance, or gap, from the first electrode (the spacing is obtained by a deposition of an insulator). This structure allows energy-efficient operation with a very thin deposition of GST since the heating is concentrated near the sublithographic gap between the two electrodes, and because there is no need for a top electrode, which may act as a heat sink. A memory cell in this structure thus requires a very small current to start melting the phase-change material. In an exemplary embodiment, the cell also exhibits greatly reduced threshold voltage when the GST material is amorphous since the separation of the two electrodes is sublithographic and thus extremely small. In an exemplary embodiment, where the GST layer covering the electrodes is large (large patterning on top of the electrodes), the resistance grows gradually for a wide range of currents, thus allowing for efficient multi-bit operation. The resistance variation is primarily due to the amorphous material occluding the current path out of the first electrode and through the crystalline material, therefore drift or other variation in the resistance of the amorphous material will affect the cell resistance only minimally. In an exemplary embodiment, the amount of amorphous material for all levels is sufficient to ensure good retention (as opposed to the extremely thin amorphous regions required to generate low to intermediate cell resistance with a micro-trench or mushroom cell).

An exemplary embodiment of the present invention makes improvements in at least three aspects of contemporary phase change memory (PCM) technology. The first improvement is a reduction in required programming power (and peak current); the second improvement is a reduction in resistance drift; and the third improvement is improved data retention with multi-bit operation of the PCM.

Reduction of the programming power and peak current are important in PCM technology because these two parameters have an impact on the design of the circuitry required to program the memory cell. In an exemplary embodiment, the circuitry required to program the memory cell includes: (i) an access device (e.g., a diode or a transistor); (ii) a bit line to support the programming current; (iii) peripheral circuitry that drives the bit line; and (iv) charge pumps whenever present.

Current techniques for the reduction of the programming current and power include: reducing the surface of the contact between one electrode (the so called heater) and the phase change material (e.g., GST), as for example in the micro-trench cells and in the mushroom cells; and reducing the cross section of the GST, thus obtaining a current crowding, such as in the bridge cell or in the pore cell. Typically these reductions are achieved by obtaining key geometrical features of the cell with sublithographic techniques. For example, in the micro-trench cell, the heater has a sublithographic dimension. In the mushroom cell, the bottom contact can be obtained with a sublithographic diameter. An exemplary embodiment of the present invention provides two important sublithographic dimensions, namely the thickness of the first electrode (which is similar to a micro-trench) and the lateral separation distance between the first electrode and the second electrode (defined by a deposited insulator thickness). The combination of these two sublithograhic dimensions enables heating of a smaller area than can be achieved with contemporary PCM technology, thus reducing the programming current necessary to initiate melting. Furthermore, the lateral current flow between the electrodes results in an asymmetric melt region that grows from one end of the first electrode towards the opposite end of that electrode as the current is increased. This is in contrast to mushroom-style and microtrench-style cells where the current flows vertically out of an electrode and generates a melt region which typically has two planes of symmetry, and is also in contrast to bridge-type cells which utilize lateral current flow but typically have constant cross-section of phase-change material which also yields a temperature profile typically having two planes of symmetry.

Resistance drift has an impact on multi-bit operation of PCM. The random nature of resistance drift may have a large impact on the reliability of PCM cells programmed with a large number of levels. Data retention with multi-bit operation is will become an issue with PCM since the common way of obtaining medium to low resistance values is to create very small quantities of amorphous material which can exhibit higher sensitivity to both trap relaxation (which is thought to determine short-term upwards resistance drift), and recrystallization (which causes long-term downward resistance drift).

Current proposals for dealing with drift are based on signal processing techniques, such as estimating and then compensating the component of drift common to a group of PCM cells, for example by means of known estimation techniques such as a maximum likelihood estimation. A drawback of this solution is that it relies on post-processing techniques at data retrieval time and it cannot compensate for the random component of drift, which has a major impact on data retention in multi-bit PCM. Other techniques that are applied at retrieval time include: reinstating the drift as perceived at programming time by means of an electrical pulse; and multiple-voltage reading of the cells. A variety of programming techniques resilient to drift have been proposed in the literature including: the use of short pulses to induce selective crystallization of small regions of the amorphous material (thus creating conductive paths through the amorphous material); and the use of drift acceleration pulses. An exemplary embodiment of the present invention creates amorphous regions of varying size between the electrodes, but with a parallel electrical path through the crystalline material around the amorphous region. In this structure, the resistance of the cell is primarily determined by the cross-sectional size of the crystalline path, which decreases as the size of the amorphous region increases. As long as the resistivity of the amorphous material is far higher (e.g., at least 100 times higher) than that of the crystalline material, the overall cell resistance determined by the parallel electrical paths through both the crystalline and amorphous regions is only very slightly affected by variations in the amorphous resistivity such as those associated with short-term drift. Exemplary embodiments are also relatively insensitive to long-term recrystallization (downward) drift because the amorphous region has to shrink by relatively large amounts to cause a large change in resistance. By contrast, intermediate resistance values in mushroom or micro-trench cells are sometimes obtained by having the amorphous region almost, but not quite, completely cover the electrode. This is sometimes referred to as the pinch-off regime, and when a cell operates near pinch-off, it only takes the recrystallization of an extremely small region to substantially change the cell resistance.

FIG. 1 illustrates a system for programming a PCM in accordance with exemplary embodiments of the present invention. The system depicted in FIG. 1 includes a processor 102, and a memory array 108. The exemplary processor 102 depicted in FIG. 1 includes a controller 104 and an address decoder 106. As depicted in FIG. 1, the memory array 108 includes a plurality of memory cells 110. In an exemplary embodiment, a memory cell 110 is configured to store binary data represented by at least two resistance states or configurations of phase change material (referred to as a "single level cell" or "SLC"). One of the resistance states is a high resistance state. In another exemplary embodiment, the memory cell 110 is configured to store more than two values represented by three or more resistance state ranges or configurations of phase change material (referred to as a "multiple level cell" or "MLC").

In an exemplary embodiment, the controller 104 identifies and selects memory cells 110 in the memory array 108 for programming. The address decoder 106 then decodes memory addresses from the controller 104 and applies a range of word line biases to the memory cells 110 in the memory array 108.

Figure 2:
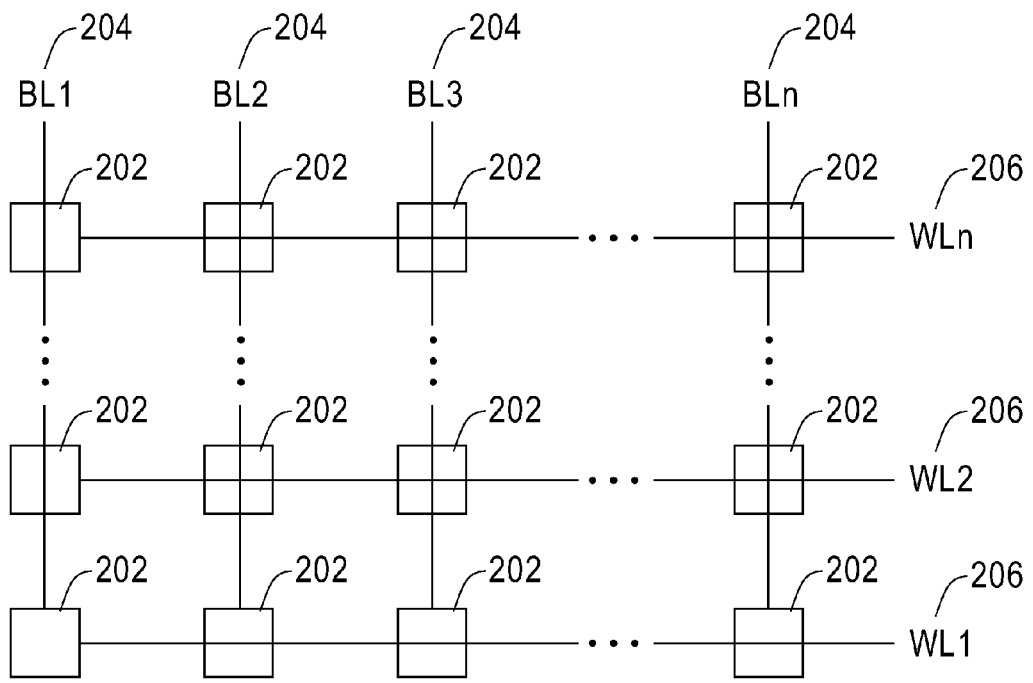
FIG. 2 depicts an example structure of a memory array in accordance with exemplary embodiments.

FIG. 2 depicts an example structure of a memory array in accordance with exemplary embodiments. As shown in FIG. 2, the memory array includes a plurality of memory cells 202 electrically coupled to bit lines 204 and word lines 206. In an exemplary embodiment, each memory cell 202 is comprised of a memory element access device and a resistive memory element for storing a resistance value. In an exemplary embodiment, the resistive memory element is a PCM element that includes phase change material and two electrodes. In an exemplary embodiment, the data in a memory cell 202 connected to a bit line 204 is accessed (read or programmed) by turning off the access devices of other memory cells 202 connected to the bit line 204. The access devices of the other memory cells 202 are turned on and off using the word lines 206.

Figure 3:
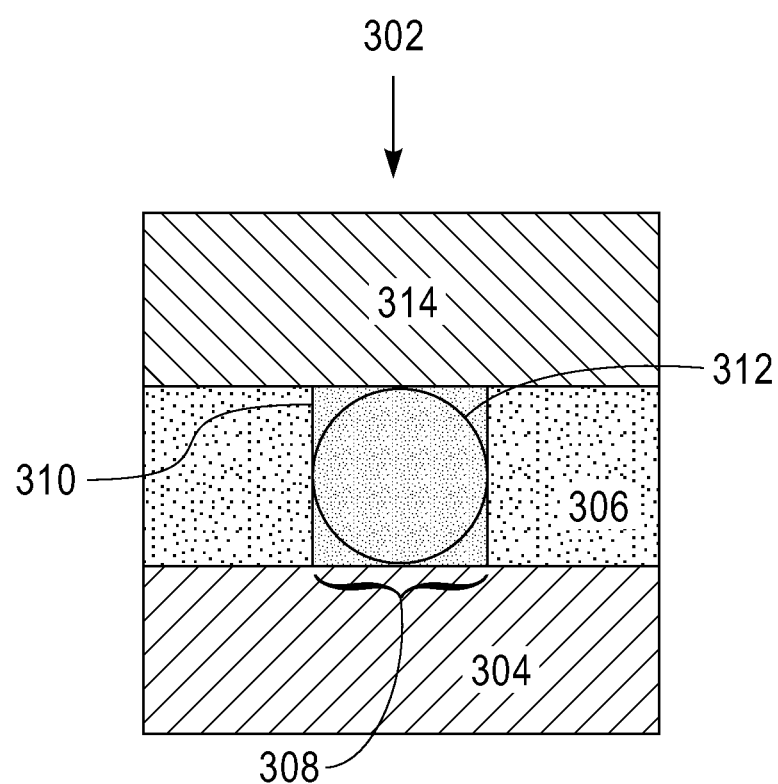
FIG. 3 depicts a typical memory cell with a series electrical path.

FIG. 3 depicts a typical series-path memory cell 302. The memory cell 302 includes a bottom electrode 304, a dielectric layer 306, phase change material 308, and a top electrode 314. The phase change material 308 shown may be comprised of crystalline or polycrystalline phase change material 310 and a volume of amorphous phase change material 312. For many moderate to high cell resistance levels, the amorphous material almost completely occludes the cross-section of the phase-change material, forcing a significant fraction of the current to flow through amorphous and crystalline material regions in series.

Figure 4:
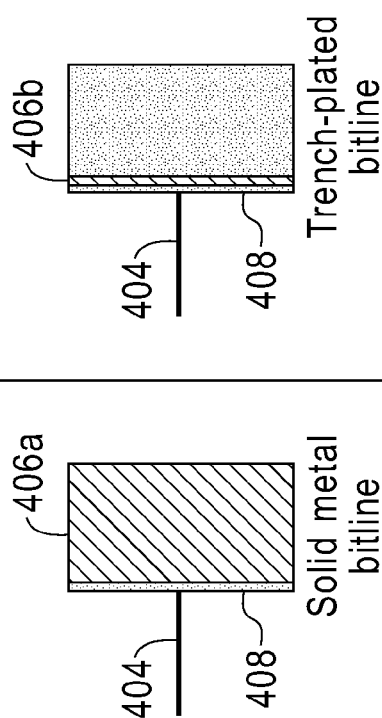
FIGS. 4A-4D depict parallel-path memory cell structures that may be implemented by exemplary embodiments.

FIGS. 4A-4D depict parallel path memory cell structures that may be implemented by exemplary embodiments. FIGS. 4A-4D depict a top view, looking down through a storage material layer. FIG. 4A depicts a parallel path memory cell structure that includes a first conductive electrode region 404, a second conductive electrode region 406a and an insulator layer 408. As shown in FIG. 4A, an edge of the second conductive electrode region 406a is at an angle to the axis of the first conductive electrode region 404. Exemplary embodiments are not limited to the angle being a right angle as depicted in FIG. 4A. As used herein, the term "angle" in the context of the first and second conductive electrode regions refers to any angle that is intentionally introduced during design or fabrication to make the electrodes non-parallel. In one embodiment, the angle is between 20 and 80 degrees. The second conductive electrode region 406a depicted in FIG. 4A is implemented by a solid metal line that may be formed, for example, by filling in a trench with a metal substance when manufacturing the memory cell. The width of the solid metal second conductive electrode region 406a would typically be defined lithographically. The metal substance may be composed of, but is not limited to one or more of: titanium, tungsten, titanium nitride, and titanium aluminum nitride. Optionally a non-metallic conductive material can be used instead of a metal, such as but no limited to polysilicon or other semiconductor or doped semiconductor material.

FIG. 4B depicts a parallel memory cell structure that includes a first conductive electrode region 404, a second conductive electrode region 406b and an insulator layer 408. As shown in FIG. 4B, an edge of the second conductive electrode region 406a is at an angle to the axis of the first conductive electrode region 406b. The width of the first electrode varies based on the thickness of a first metal substance deposited during a step of the manufacturing process. The second conductive electrode region 406b depicted in FIG. 4B is implemented by a metal line that may be formed, for example, by coating or plating a trench wall with a second metal substance when manufacturing the memory cell. The width of the second conductive electrode region 406b varies based on the thickness of the second metal substance that is deposited in the memory cell structure during the coating or plating of the trench wall. The first and the second metal substances may be the same or different, and each may be composed of, but not limited to, one or more of: titanium, tungsten, titanium nitride, and titanium aluminum nitride. Optionally a non-metallic conductive material can be used instead of a metal, such as but no limited to polysilicon or other semiconductor or doped semiconductor material.

In FIGS. 4A and 4B, the first conductive electrode region 404 and the second conductive electrode region 406 are separated by a minimum lateral separation distance by the insulator layer 408. The minimum lateral separation distance may vary depending on memory system specifications and environmental factors. The thickness of the insulator layer 408 determines the lateral separation distance between the electrodes, and the thickness of the insulator layer is adjusted to provide a specified minimum lateral separation distance. Examples of insulator materials that may be used to form the insulator layer be implemented, but include, but are not limited to, silicon dioxide, aluminum oxide, silicon nitride, and titanium dioxide.

Thus, both FIGS. 4A and 4B depict an in-plane dual-electrode structure (i.e., both electrodes are on the bottom of the GST layer and the top surface of the GST is insulated). The exemplary structures in FIGS. 4A and 4B are characterized by one sublithographic strip electrode (the first conductive electrode region 404) (e.g., a plated trench wall having a plating thickness of about five nanometers) orthogonal to another electrode (the second conductive electrode region 406) (e.g., a plated trench wall or a solid metal line) with a sublithographic inter-electrode gap defined by a thickness of a deposited insulator film or layer (the insulator layer 408) (e.g., having a thickness of about three to twenty nanometers, or up to the feature size for the adopted lithography).

Turning now to FIG. 4C, in an exemplary embodiment, at least a portion of the first conductive electrode region 404 and the second conductive electrode region 406 are covered with a layer of storage material. In an exemplary embodiment, both the first conductive electrode region 404 and the second conductive electrode region 406a are on the bottom of the storage material layer. In an exemplary embodiment, the exemplary cell structure provides a small melt region 410 that grows asymmetrically, obscuring a variable percentage of at least the first conductive electrode region 404 as the current increases.

Turning finally to FIG. 4D, in another exemplary embodiment, the first conductive electrode region 404 and the second conductive electrode region 406a are not orthogonal to one another. In this embodiment, the current distribution and the melt region will no longer be symmetric with respect to the axis of the first conductive electrode region 404. In fact, this embodiment has no planes of symmetry.

The embodiments depicted in FIGS. 4A-4D are meant to be illustrative rather than restrictive, and the invention is intended to apply to any configuration where the axis of the first conductive electrode region 404 and the axis of the edge of the second conductive electrode region 406 are designed to be non-parallel. This is distinct from a typical bridge cell having parallel electrodes. In other exemplary embodiments, first conductive electrode regions 404 non-parallel to second conductive electrode regions 406 are obtained by etching a first trench along a non-straight path, such as, but not limited to, a zig-zag path, a saw-tooth path, a series of non-connected oblique lines. In other exemplary embodiments the second trench can be etched in a non straight path such as but not limited to a zig-zag path or a curved periodical path. Contacts to the first or the second conductive electrode regions can be provided below the electrode, such as in a buried layer obtained from a previous sequence of manufacturing steps. Alternatively, the contacts may be above the electrode, manufactured after the manufacturing of the described invention. The contact, for example, in the case of the second conductive electrode region can be provided as a prolongation of the electrode itself, by electrically connecting it to adjacent electrodes.

Figure 5:
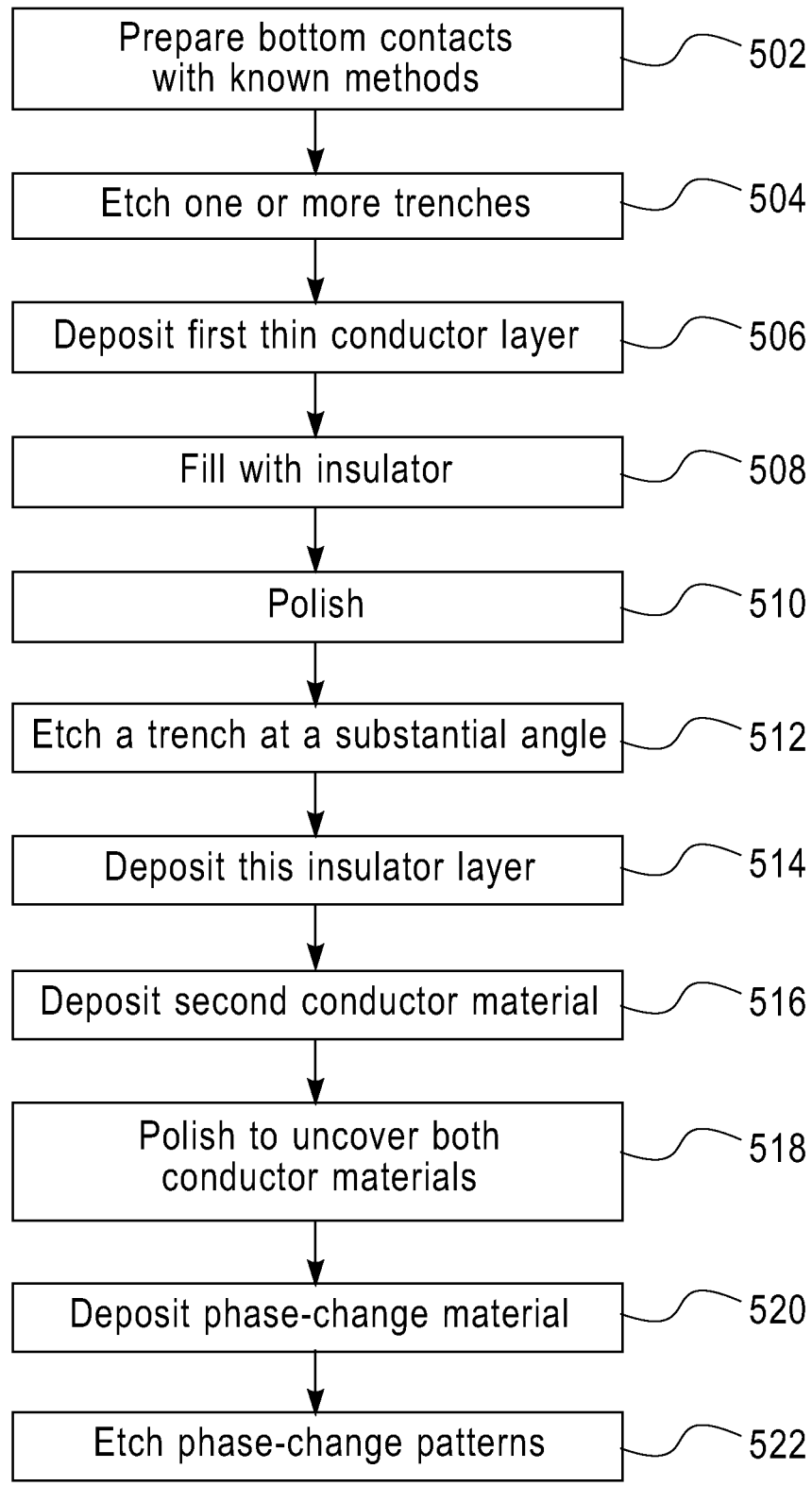
FIG. 5 depicts a fabrication process that may be implemented by exemplary embodiments.

FIG. 5 depicts a summary of a fabrication, or manufacturing, process that may be implemented by exemplary embodiments. At block 502, bottom contacts are obtained through techniques known in the art. An optional insulator layer is deposited then at block 504, one or more trenches are etched so that the bottom of the trenches exposes the bottom contacts. At block 506, a conductor layer is deposited. An insulator is deposited to fill the trench at block 508. By means of a polishing technique known in the art the top surface is made planar at block 510. At block 512, a trench is etched at an angle from the first trench(es) etched at block 504. At block 514, a thin insulator layer is deposited followed by the deposition of a second conductor material at block 516. At block 518, the structure is planarized by polishing the surface; the polishing uncovers both conductor materials. At block 520, phase change material such as GST is deposited and then patterned through etching at block 522.

Figure 6:
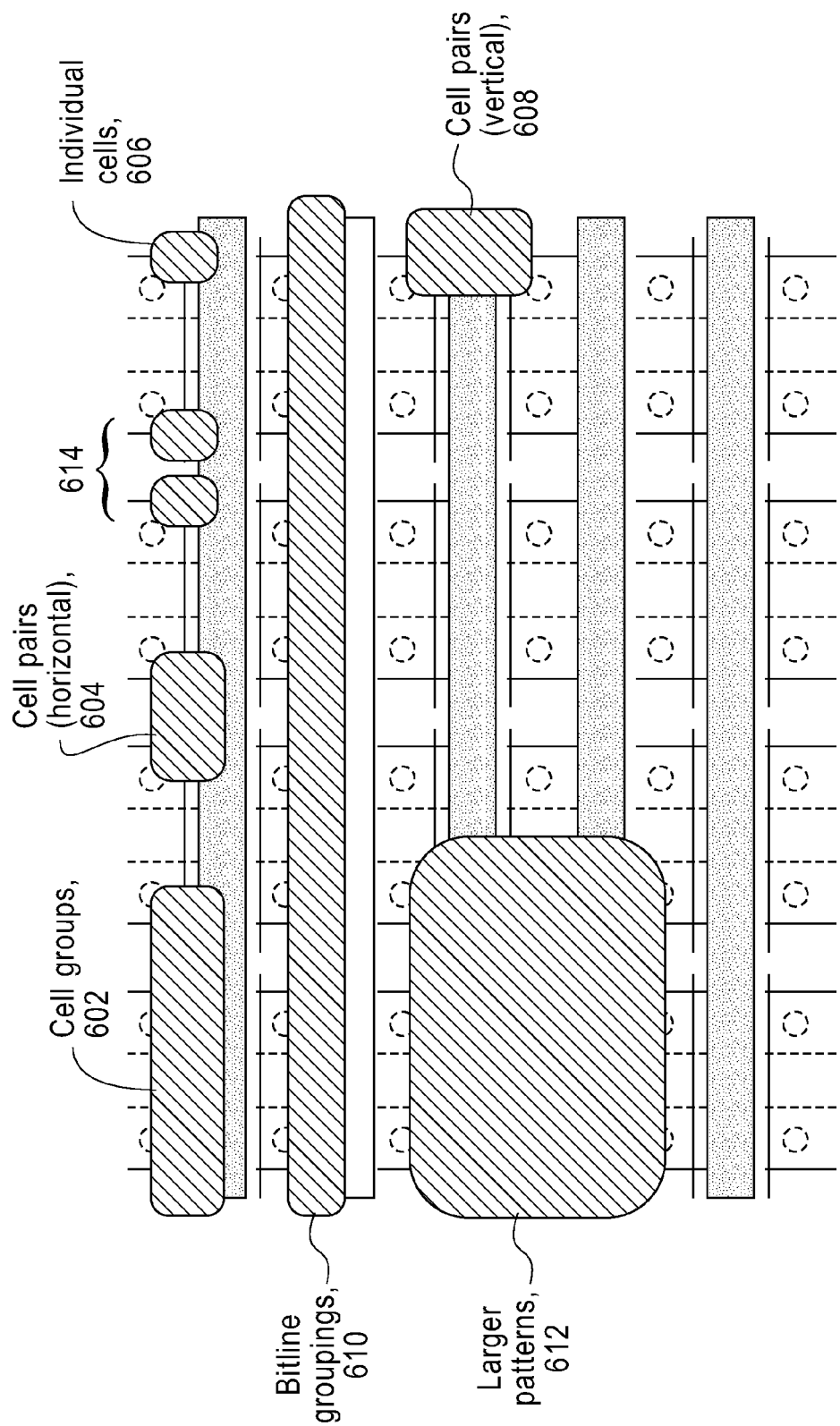
FIG. 6 depicts exemplary shapes for phase change material patterns that may be implemented by exemplary embodiments.

FIG. 6 illustrates exemplary shapes of a phase change material that may be obtained through the last etching step at block 522 of FIG. 5. In exemplary embodiments, the GST pattern covers a single pair of electrodes 606 614, two adjacent pairs of electrodes 604 608, more than two pairs of adjacent electrodes 602 610 (either in the vertical direction or the horizontal direction), and/or a rectangular region covering a number of pairs of adjacent electrodes 612. These various configurations are not meant to limit the scope of the invention and additional configurations can be used.

In exemplary embodiments, normal operation of the cell may comprise the steps of creating an amorphous or a crystalline region by melting a region and then rapidly quenching (to create amorphous material) or reducing the current so that the region crystallizes while cooling (to create crystalline material). Another typical operation is to convert some or all of an amorphous region without melting, by heating enough, and for long enough time, for crystallization to occur. In exemplary embodiments, the memory cell can be programmed to a specific resistance value by applying an electrical signal large enough to cause the melting of a region that will create an amount of amorphous material sufficient for creating the desired resistance value. The peak value of the electrical signal can be estimated using finite element analysis of the cell. Alternatively, the cell can be programmed with a pulse that melts a sufficiently large region, slowly decreases to the above described peak value and is abruptly removed to quench the molten phase-change material. In exemplary embodiments, the modes of operation of the cell are preceded by an initialization process that confines the crystalline region into a sub-lithographic area.

Figure 7:
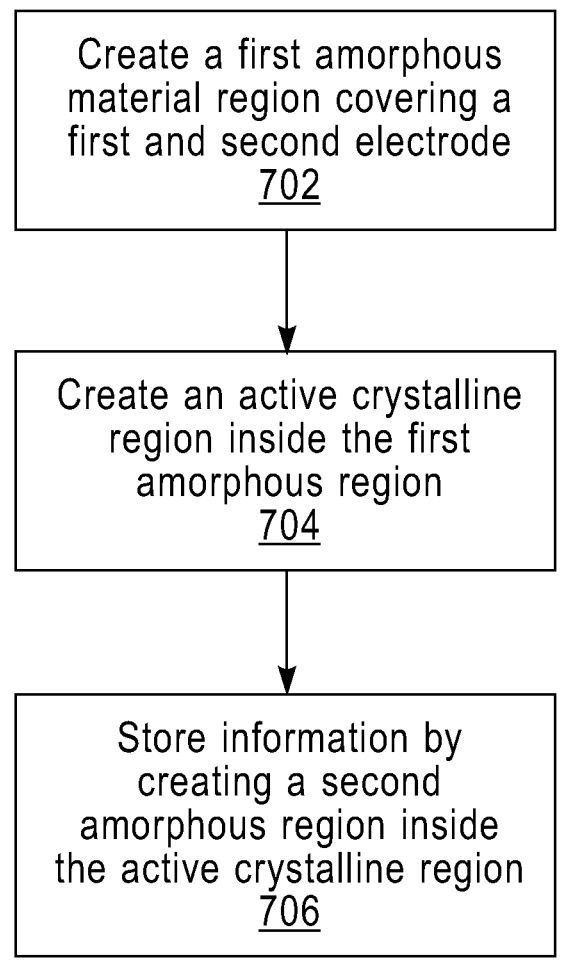
FIG. 7 is a flow chart for initializing a memory cell that may be implemented by an exemplary embodiment.

For some manufacturing processes an embodiments, it may be desirable to perform an initialization process before the cell is used to store data (e.g., after fabrication) and then periodically during the device lifetime. FIG. 7 is an exemplary flow chart for such an initializing process. In an exemplary embodiment, at the end of the manufacturing process, a crystalline phase change material is covering the first conductive electrode region 404 (e.g., a substantial portion) and the second conductive electrode region 406 (e.g., at least a portion or at least partially covers) in a memory cell. To initialize the cell, at block 702, a first amorphous material region covering a portion of the first conductive electrode region 404 is created. In an embodiment, the first amorphous region covers a substantial area of the phase change material including a portion of the first conductive electrode region 404. In some cases, a portion of the second conductive electrode region 406 may also be covered by the amorphous region, but this is not required for operation or initialization according to exemplary embodiments of the present invention. In an exemplary embodiment, the first amorphous material region is created by initially applying a maximal electrical pulse that is of a larger magnitude than will be used for normal write processes. The electrical pulse is applied via at least one of the first conductive electrode region 404 and the second conductive electrode region 406. At block 704, an active crystalline material region is created inside the first amorphous material region by crystallizing a portion of the first amorphous material region. In an exemplary embodiment, the active crystalline material region is created by applying an electrical pulse smaller than the initial maximal electrical pulse. The electrical pulse is applied via at least one of the first conductive electrode region 404 and the second conductive electrode region 406. The cell is now initialized and ready for use storing data. At block 706, data is stored in the memory cell by creating a second, smaller amorphous material region inside the active crystalline material region. In an exemplary embodiment, the second amorphous material region is created by applying a pulse that is smaller than the first maximal pulse which created the first amorphous region, and of shorter duration than the second pulse which created the active crystalline material region.

The process shown in FIG. 7 is advantageous for several reasons. First, it can take advantage of the fact that drive transistors can typically drive much more current for a small number of cycles than they can for a large number of cycles. Thus, a single very large current pulse can be generated and used to amorphize as much as possible of the crystalline film over the electrodes before the system is used for data storage. This minimizes the amount of undesirable current which flows between the two electrodes in the regions far from the peak temperature region near the narrow insulated gap between the electrodes. Secondly, the process allows a smaller active crystalline region to be generated by annealing a "working region" inside the larger amorphous region. The size of the active crystalline region can be controlled to precisely create a desired minimum cell resistance, which will be the result of the parallel combination of an outer path through any crystalline material outside of the amorphous region plus an inner path through the active crystalline region. Controlling (e.g., being able to adjust or adjusting) the size of the active crystalline region provides precise control of the minimum cell resistance and enables data storage through the creation of a fixed or variable-sized amorphous region inside of the active crystalline region. In an embodiment, the volume of the amorphous phase change material is increased by applying an electrical pulse having an amplitude larger than a previously applied electrical pulse and/or a duration shorter than a previously applied electrical pulse, the applying via one or both of the electrodes. In an embodiment, the volume of the amorphous phase change material is decreased by applying an electrical pulse having an amplitude lower than a previously applied electrical pulse and/or a duration longer than a previously applied electrical pulse, the applying In an alternative exemplary embodiment, the manufacturing process is designed such that all of the phase change material is initially in the amorphous state. In this embodiment, block 702 in FIG. 7 is not needed since everything is already amorphous, and preparing a memory cell for use will only require block 704 in FIG. 7 to be performed. Once a crystalline region is created inside the amorphous film, data can be stored by selectively creating a second amorphous region of the desired size inside the active crystalline region.

FIGS. 8A-8J depict a manufacturing process for creating a memory cell on a substrate in accordance with exemplary embodiments. The substrate may be any structure on which another structure is then built. The processing depicted in FIGS. 8A-8J may be utilized to create the parallel path memory cell structure depicted in FIG. 4A.

Figure 8A:
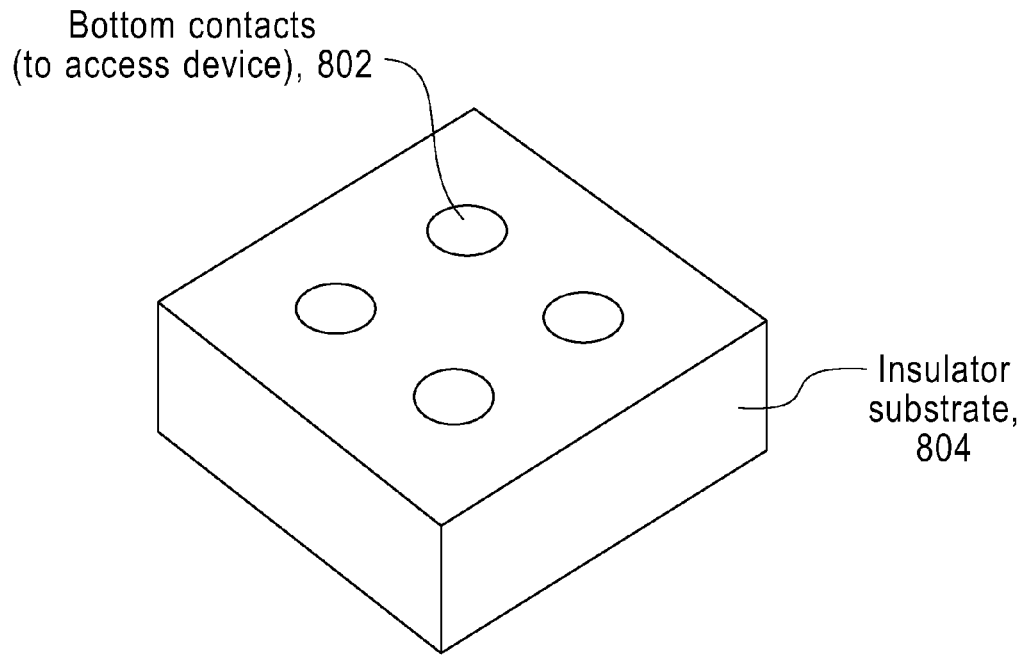
FIGS. 8A-8J depict a manufacturing process for creating a memory cell in accordance with exemplary embodiments.

FIG. 8A depicts a pre-processed wafer that includes four bottom contacts 802 for connecting to an access device and an insulator substrate 804.

Figure 8B:
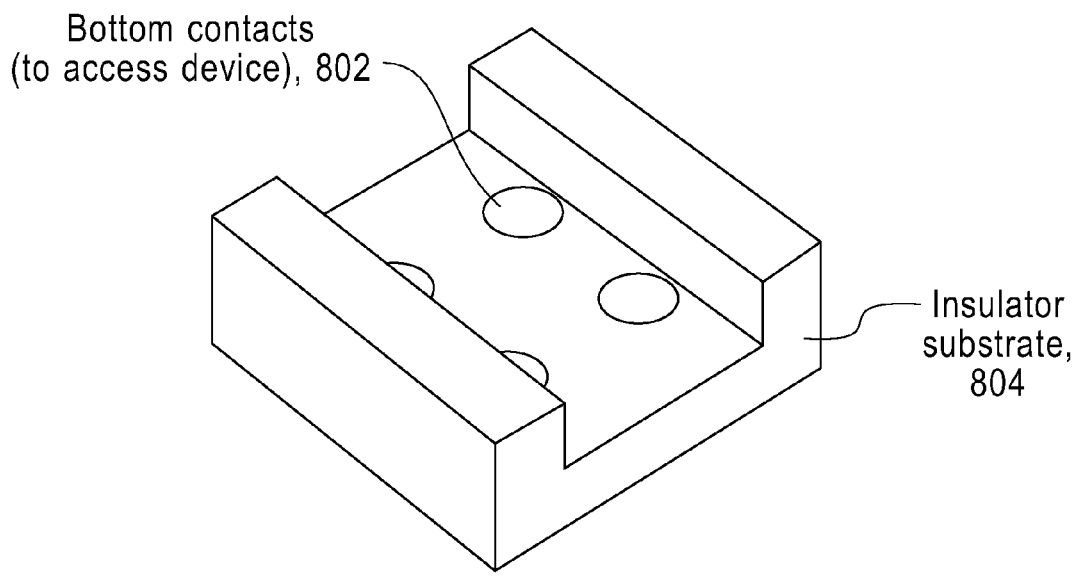

In FIG. 8B, a first trench is etched in the pre-processed wafer. In an exemplary embodiment, the first trench is 2 F-3 F wide on 4 F centers, where F represents the minimum lithographically definable feature size, and 2 F represents the minimum lithographically definable line pitch for a lithography generation of F (e.g., F=35 nm for the 35 nm lithography generation).

Figure 8C:
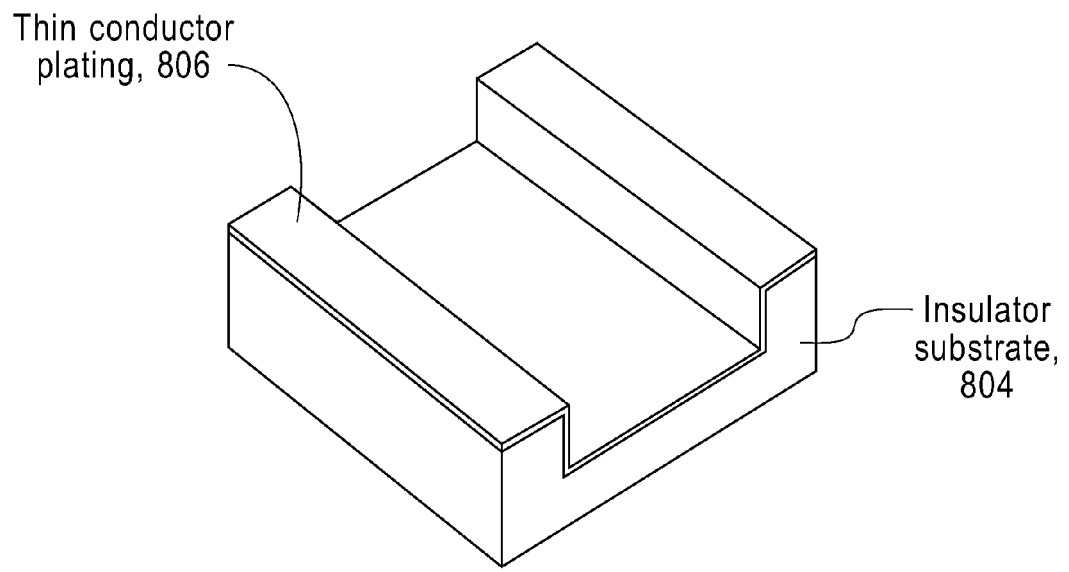

In FIG. 8C, the bottom and sidewalls of the first trench are plated with a conductor (e.g., metal), in order to apply a thin conductor plating 806. The thickness of the thin conductor plating 806 on the sidewalls of the trench determines the width of the first conductive electrode region 404.

Figure 8D:
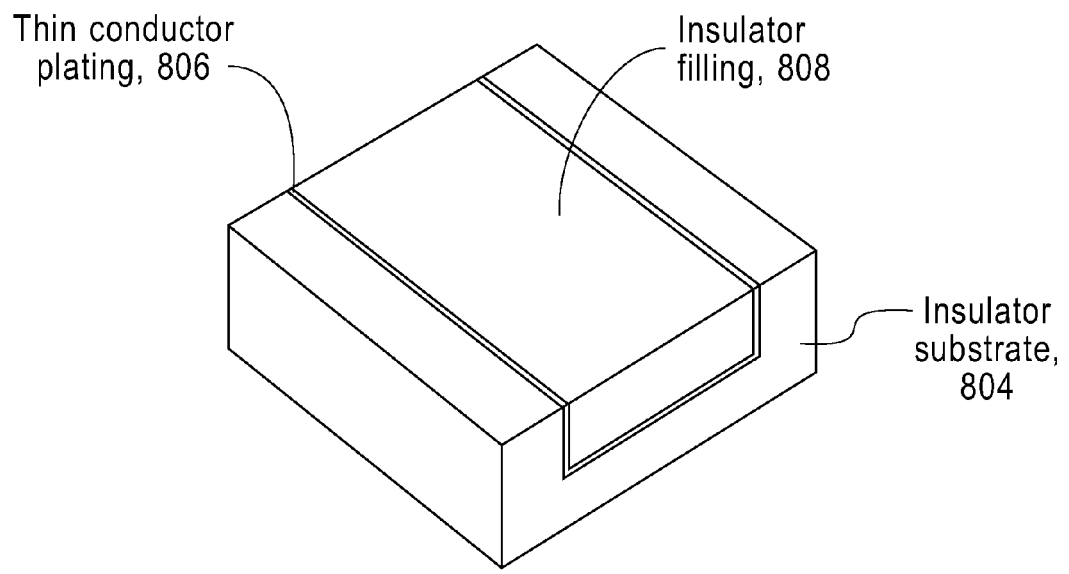

In FIG. 8D, the first trench is filled with an insulator filling 808 and polished or planarized to remove the excess plating.

Figure 8E:
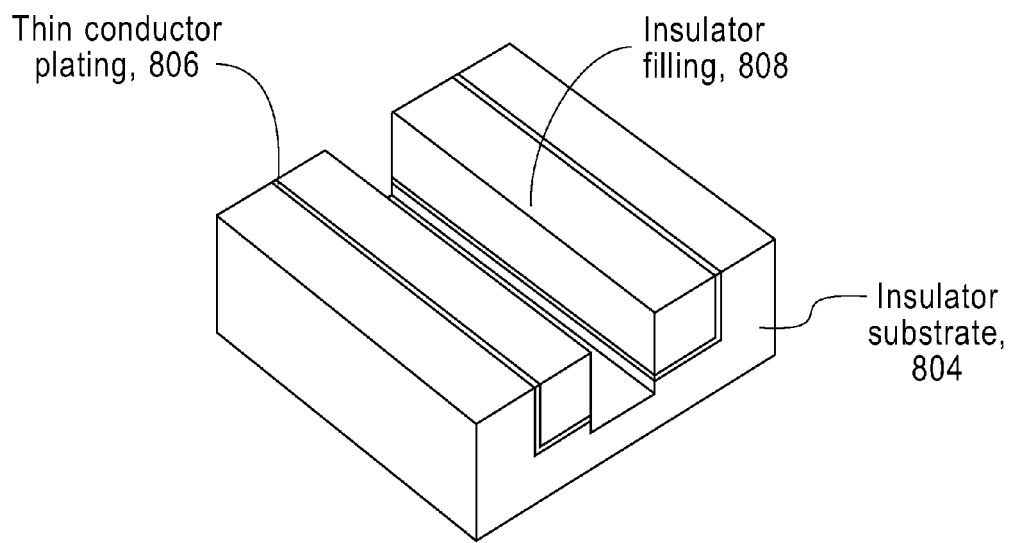

In FIG. 8E, a lengthwise slot is etched to separate the two sides of the first trench. In an exemplary embodiment, the lengthwise slot is approximately 1 F wide.

Figure 8F:
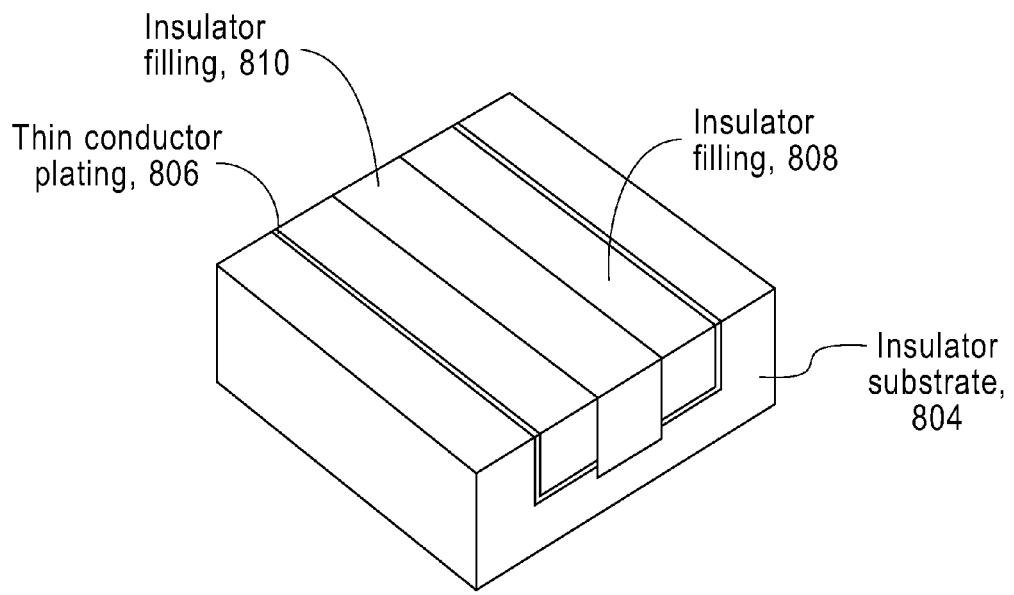

In FIG. 8F, an insulator layer or insulator filling 810 is deposited in the lengthwise slot and the structure is polished or planarized again.

Figure 8G:
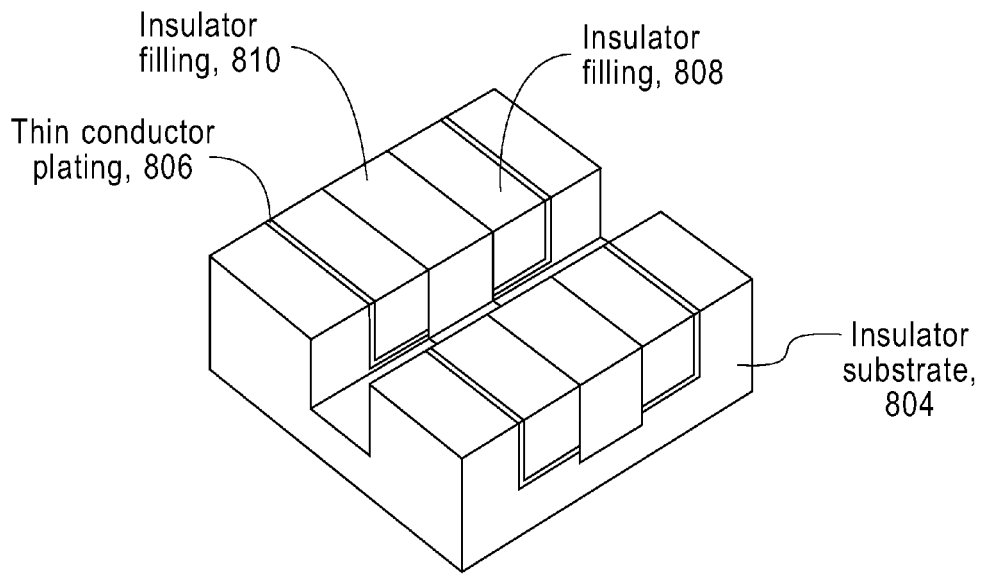

In FIG. 8G, a perpendicular trench is etched. In an exemplary embodiment, the perpendicular trench is 1 F wide and would normally be repeated on 2 F or 4 F centers. Note that only one trench is shown for simplicity of visualization.

Figure 8H:
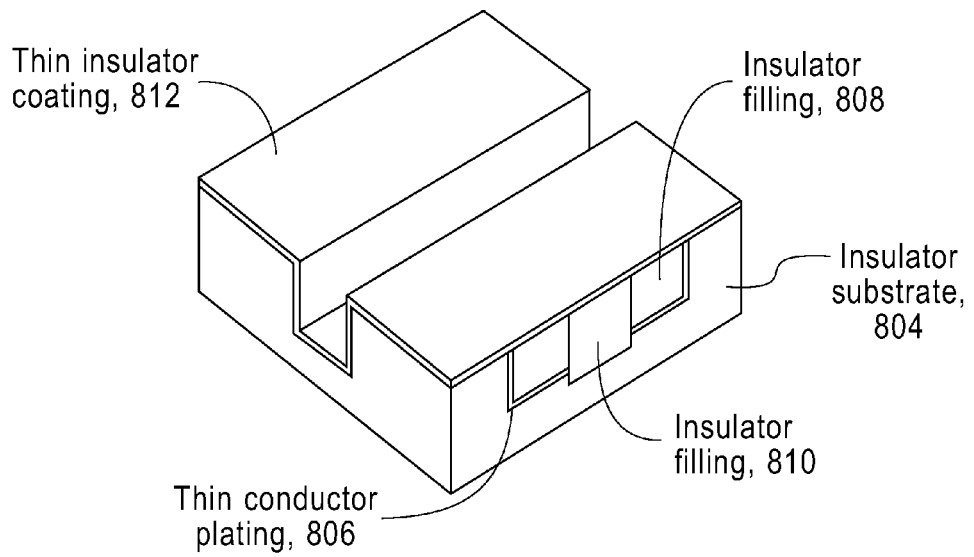

In FIG. 8H, a thin insulator coating 812 is applied to define the gap between the first conductive electrode region 404 and the second conductive electrode region 406. The thin insulator coating 812 on the sidewalls of the trench corresponds to the insulator layer 408 shown in FIG. 4A.

Figure 8I:
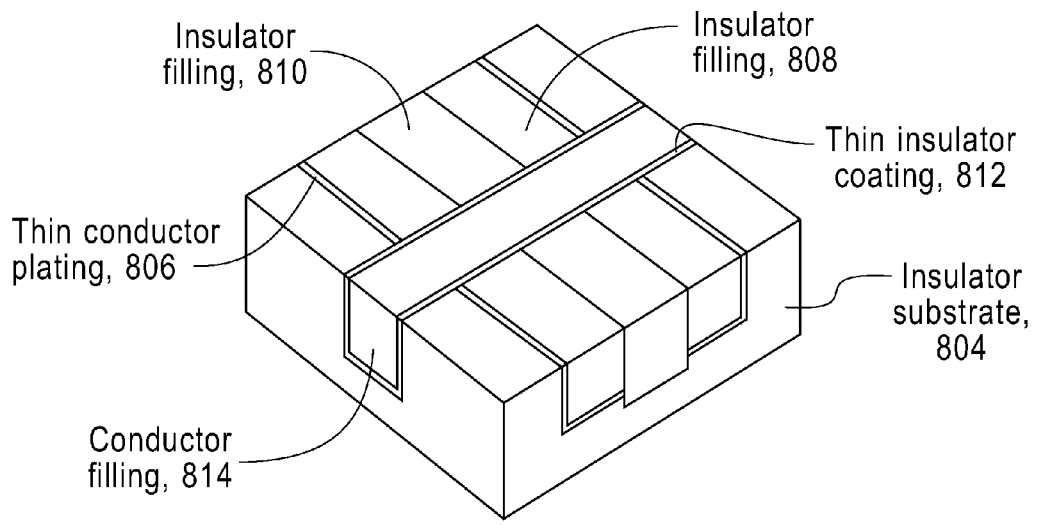

In FIG. 8I, the perpendicular trench is filled with a metal or conductor filling 814. The conductor filling 814 corresponds to the second conductive electrode region 406a. In an exemplary embodiment, the second conductive electrode region 406a forms a bit line 402. In an exemplary embodiment, the conductor filling 814 is polished to remove any excess from the top surface.

Figure 8J:
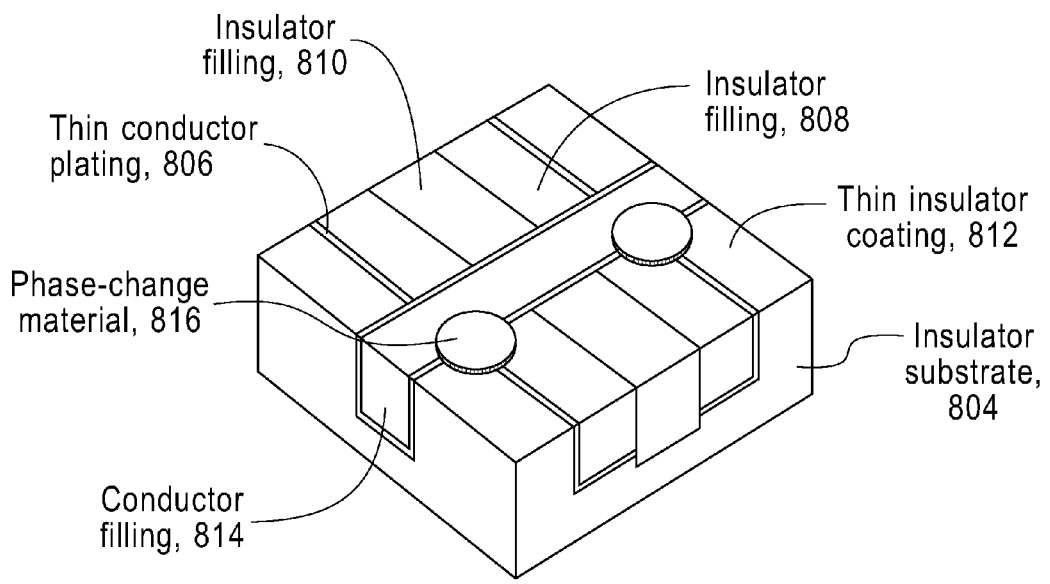

In FIG. 8J, a phase change material 816, such as GST, is deposited at an intersection of the two electrode strips (e.g., conductor filling 814 and thin conductor plating 806). In a preferred embodiment, the phase change material 816 is deposited over the entire surface and then lithographically patterned and etched to expose only one end of each first electrode strip (to avoid electrical connection of a first electrode to more than one of the second electrodes), and also to minimize the covered length of the first electrode so as to minimize current flowing far from the sublithographic insulator separating the first and second electrodes.

The manufacturing steps depicted in FIGS. 8A-8J result in a parallel path memory cell structure where the strip electrode (the first conductive electrode region 404) is laterally separated from the edge of the bit line (the second conductive electrode region 406a) by the thin insulator coating 812 (the insulator layer 408). In an exemplary embodiment, the minimum lateral separation distance is defined by the thickness of the thin insulator coating 812.

FIGS. 9A-9I depict a manufacturing process for creating a memory cell in accordance with an alternate exemplary embodiment. The processing depicted in FIGS. 9A-8I may be utilized to create the parallel memory cell structure depicted in FIG. 4B.

Figure 9A:
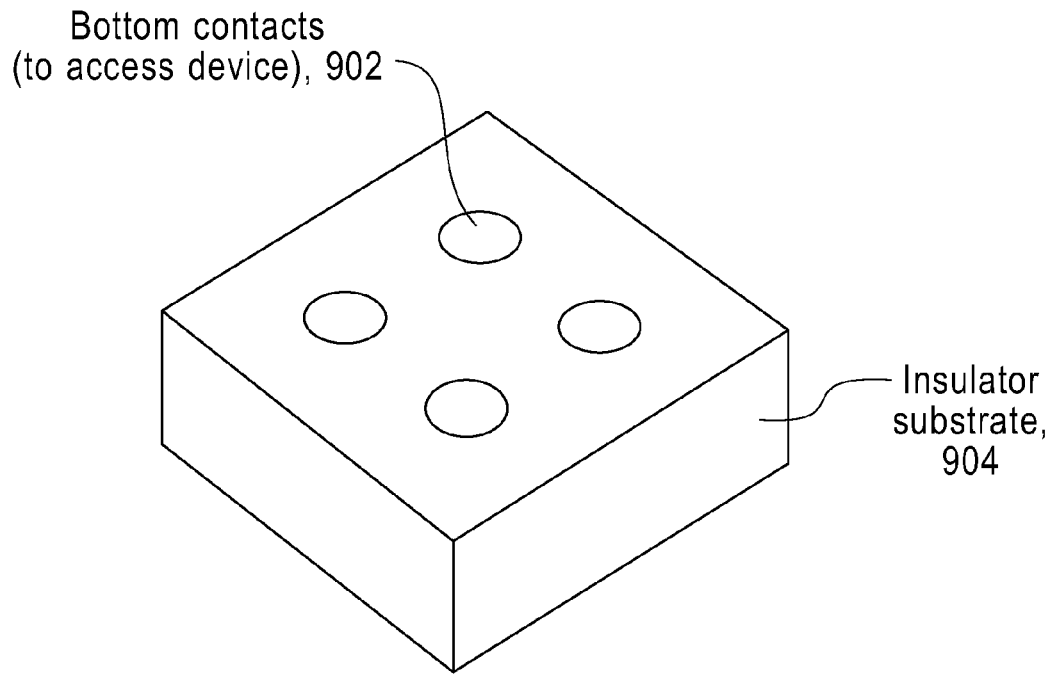
FIGS. 9A-9I depict a manufacturing process for creating a memory cell in accordance with exemplary embodiment.

FIG. 9A depicts a pre-processed wafer that includes four bottom contacts 902 for connecting to an access device and an insulator substrate 904.

Figure 9B:
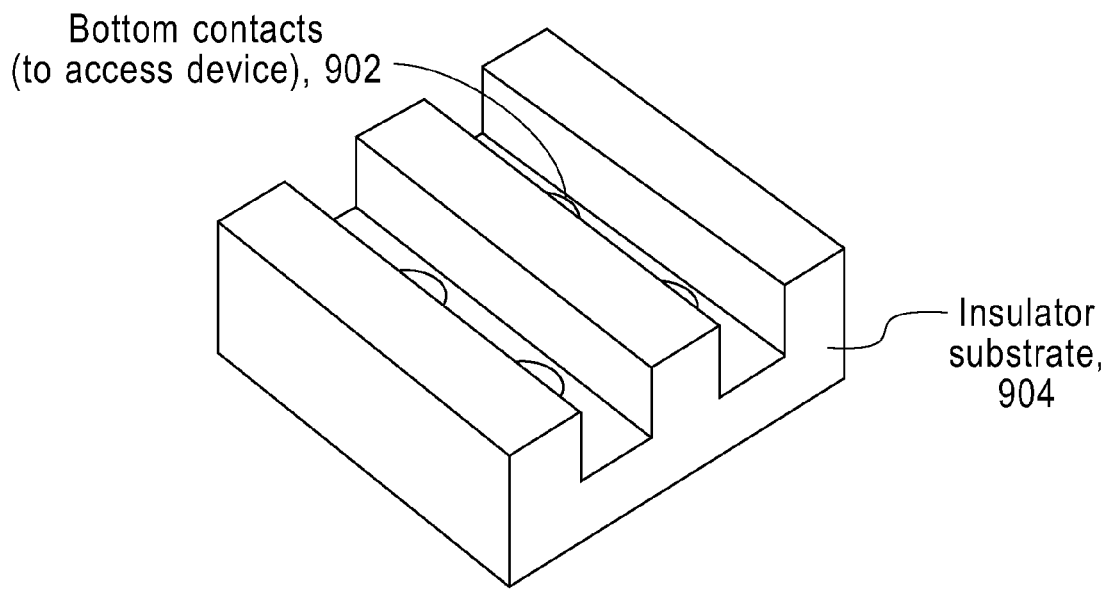

In FIG. 9B, two trenches are etched in the pre-processed wafer. Each trench exposes two of the four bottom contacts 902.

Figure 9C:
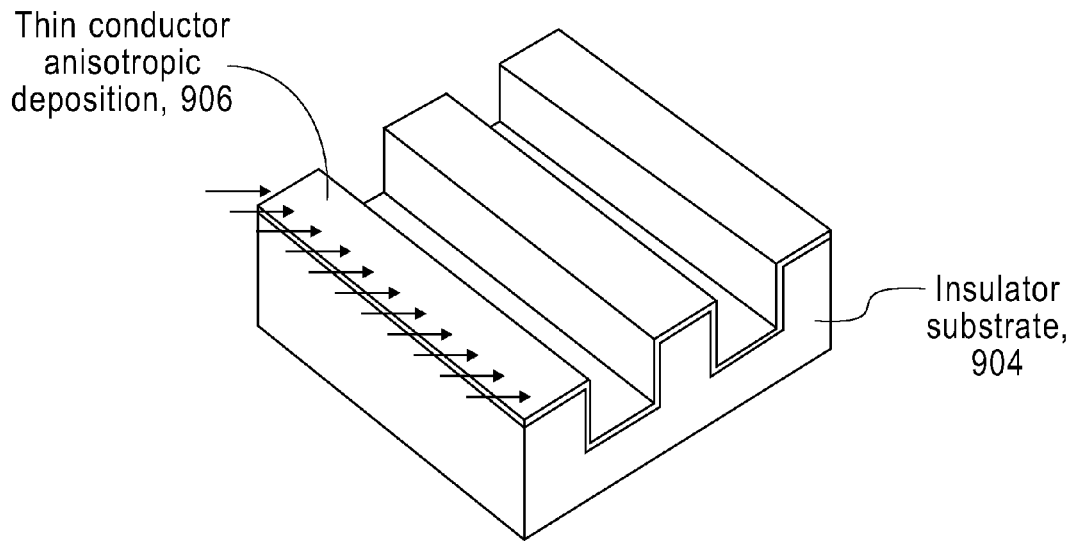

In FIG. 9C, a directional electrode deposition process is performed to create a single-side-wall electrode. As shown in FIG. 9C, at least the top, bottom and one side of the trenches are covered with the thin conductor anisotropic deposition 906. The thickness of the thin conductor anisotropic deposition 906 on the sidewall determines the width of the first conductive electrode region 404. In an alternative embodiment, a conformal deposition process can be followed by a directional etching process (from the opposite direction to that shown) to obtain substantial coverage of only the bottom and one vertical wall of the trench.

Figure 9D:
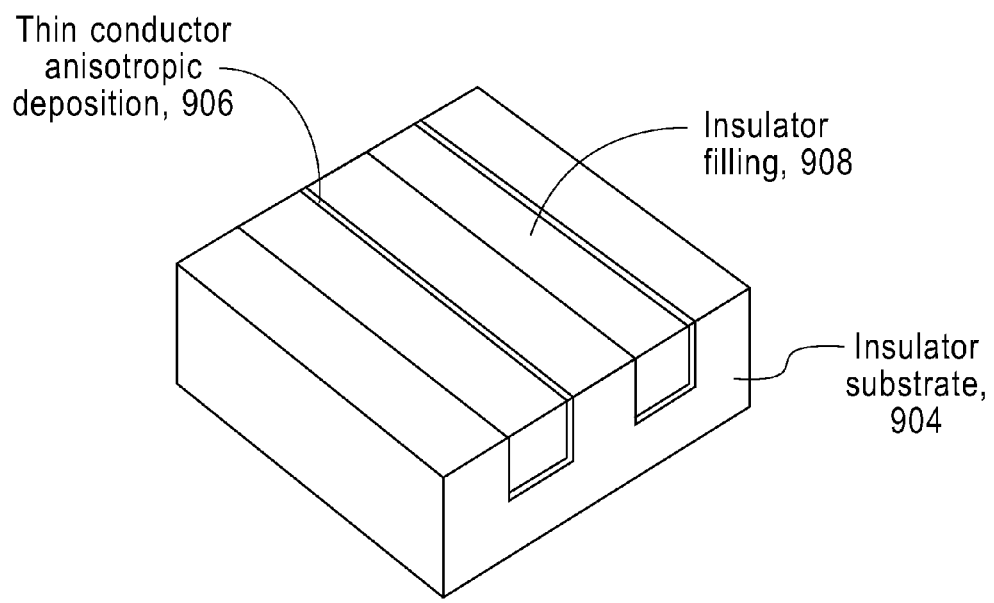

In FIG. 9D, the trenches are filled with an insulator filling 908 and planarized to remove excess material.

Figure 9E:
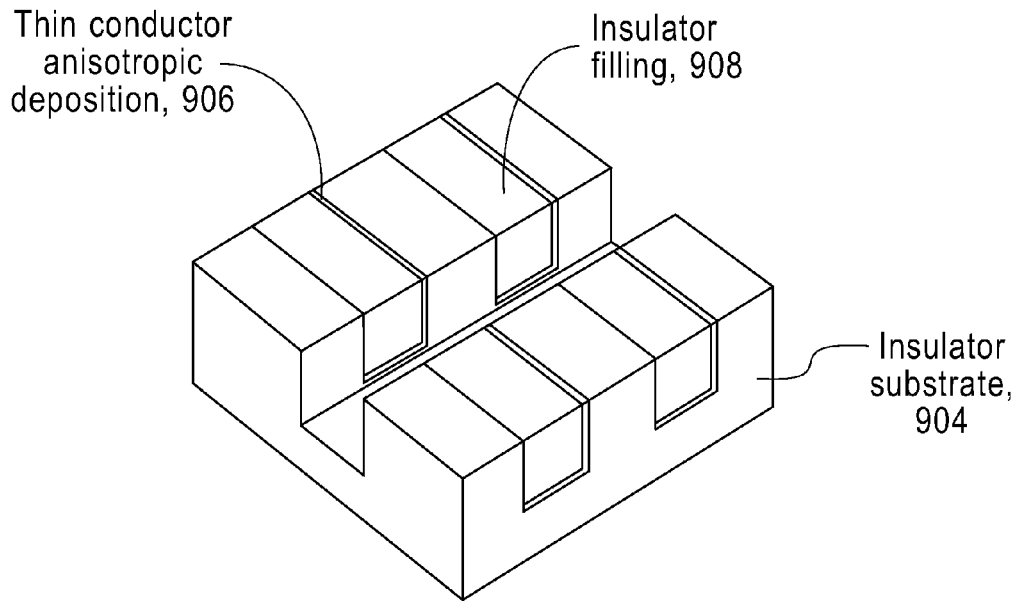

In FIG. 9E, a perpendicular trench is etched into the insulator substrate 904.

Figure 9F:
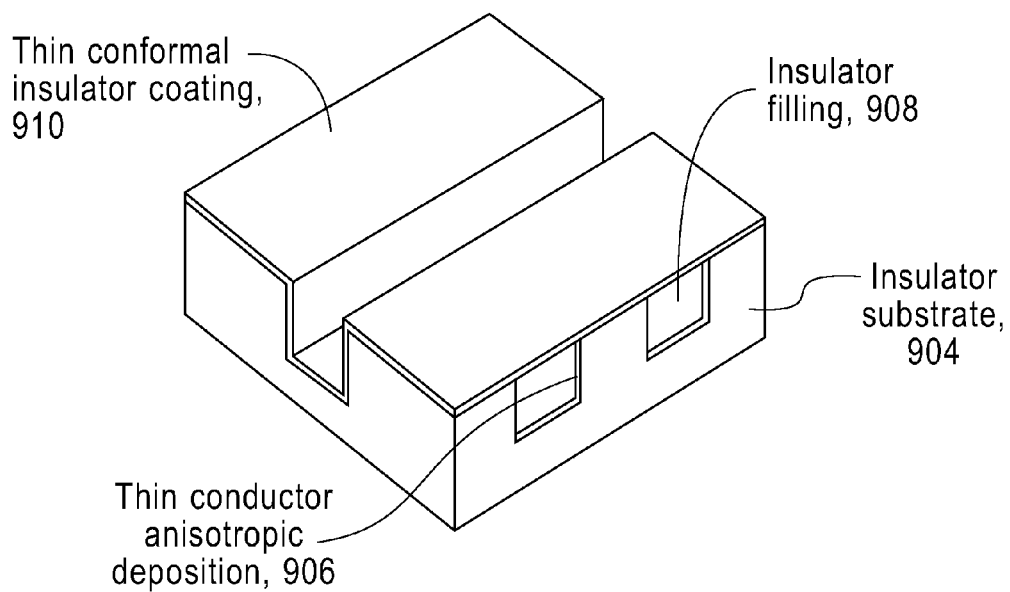

In FIG. 9F, a thin conformal insulator coating 910 is applied to coat the top surface and the trench. The thin conformal insulator coating 910 corresponds to the insulator layer 408 depicted in FIG. 4B.

Figure 9G:
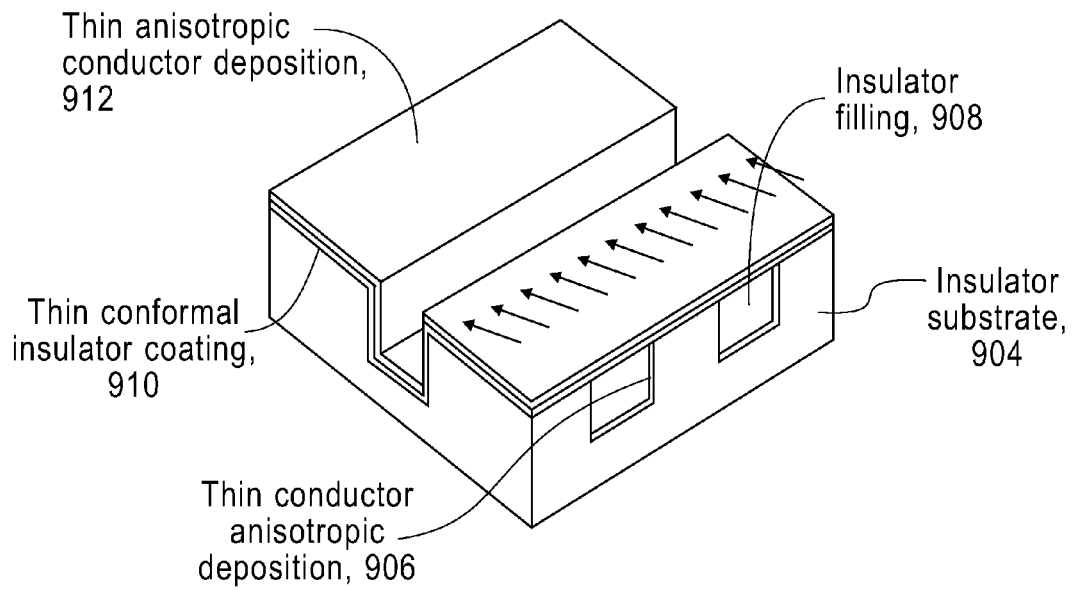

In FIG. 9G, a thin directional, non-conformal conductor deposition 912 is applied to coat the top and at least one sidewall of the trench. In an exemplary embodiment, the sidewall thickness of the thin anisotropic conductor deposition 912 corresponds to the thickness of the second conductive electrode region 406b. In an alternative embodiment, a conformal deposition process is followed by a directional etching process (from the opposite direction to that shown) to obtain substantial coverage of only the bottom and one vertical wall of the trench.

Figure 9H:
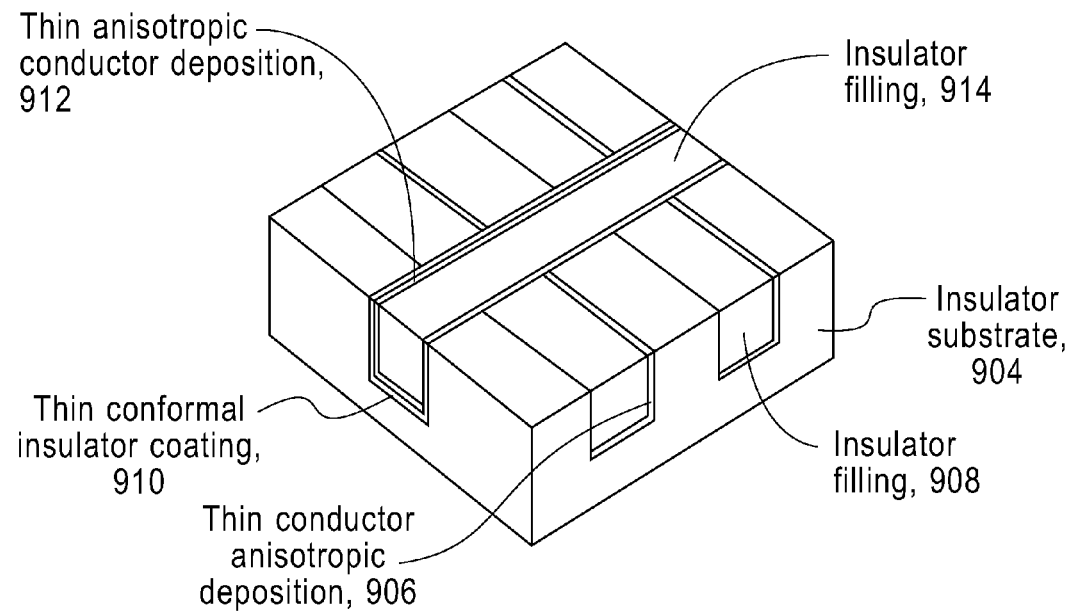

In FIG. 9H, the trench is filled with an insulator filling 914 and planarized.

Figure 9I:
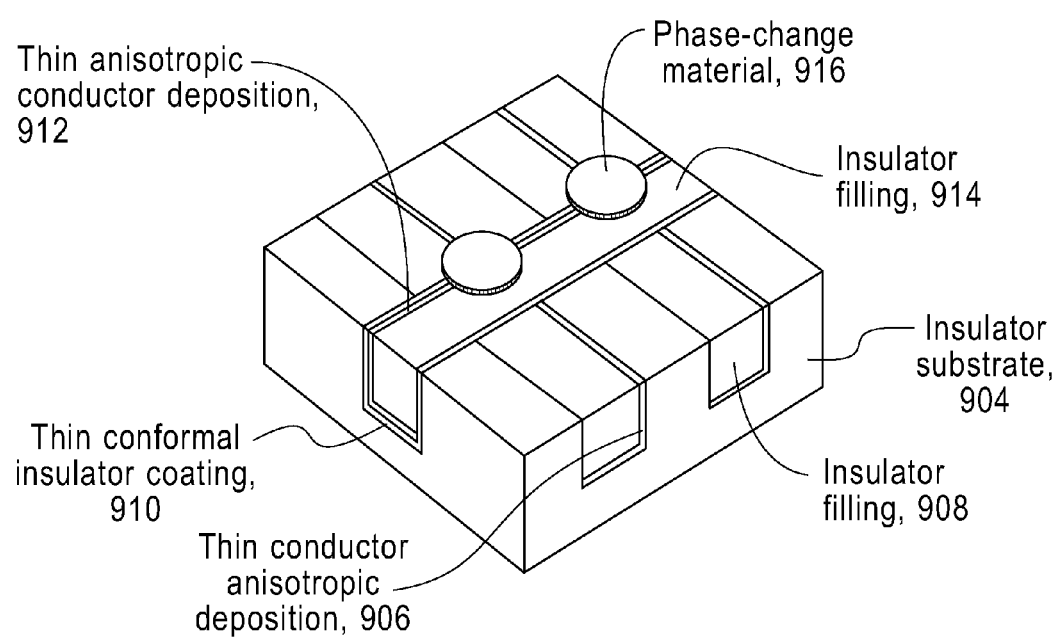

In FIG. 9I, a phase change material 916 is deposited at an intersection of the two electrode strips (e.g., thin anisotropic conductor deposition 912 and thin conductor anisotropic deposition 906). The phase change material 616 is lithographically patterned and etched to expose one end of each electrode strip to avoid electrical connection to a second bit-line (not shown).

The manufacturing steps depicted in FIGS. 9A-6I result in a parallel path memory cell structure where the strip electrode (the first conductive electrode region 404) is laterally separated from the edge of the bit line (the second conductive electrode region 406b) by the thin insulator coating 910 (the insulator layer 408). In an exemplary embodiment, the minimum lateral separation distance is defined by the thickness of the thin insulator coating 910. An advantage of this embodiment relative to the approach shown in FIG. 8 is that the active regions of all memory cells are at a fixed pitch (typically 2 F) in both directions. A second advantage of this embodiment is the thin exposed surface of the second electrode, which reduces heat dissipation (thus reducing programming current).

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Figure 10:
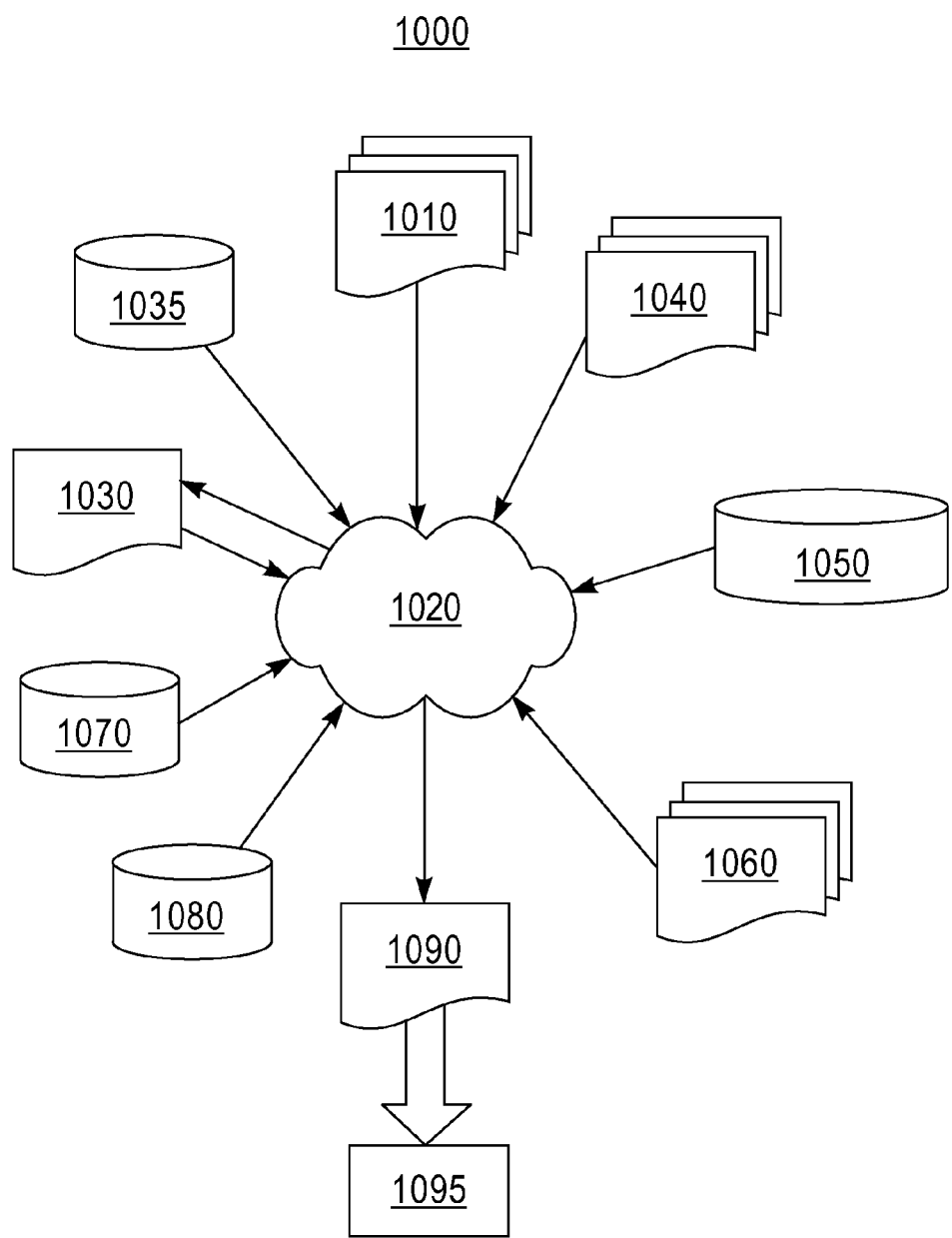
FIG. 10 is a flow diagram of a design process used in semiconductor design, manufacture, and/or test.

FIG. 10 shows a block diagram of an exemplary design flow 1000 used for example, in semiconductor IC logic design, simulation, test, layout, and manufacture. Design flow 1000 includes processes, machines and/or mechanisms for processing design structures or devices to generate logically or otherwise functionally equivalent representations of the design structures and/or devices described above and shown in FIGS. 4A-4D, 6, 8I, and 9I.

The design structures processed and/or generated by design flow 1000 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1000 may vary depending on the type of representation being designed. For example, a design flow 1000 for building an application specific IC (ASIC) may differ from a design flow 1000 for designing a standard component or from a design flow 1000 for instantiating the design into a programmable array, for example a programmable gate array (PGA) or a field programmable gate array (FPGA) offered by Altera® Inc. or Xilinx® Inc.

FIG. 10 illustrates multiple such design structures including an input design structure 1020 that is preferably processed by a design process 1010. Design structure 1020 may be a logical simulation design structure generated and processed by design process 1010 to produce a logically equivalent functional representation of a hardware device. Design structure 1020 may also or alternatively comprise data and/or program instructions that when processed by design process 1010, generate a functional representation of the physical structure of a hardware device. Whether representing functional and/or structural design features, design structure 1020 may be generated using electronic computer-aided design (ECAD) such as implemented by a core developer/designer. When encoded on a machine-readable data transmission, gate array, or storage medium, design structure 1020 may be accessed and processed by one or more hardware and/or software modules within design process 1010 to simulate or otherwise functionally represent an electronic component, circuit, electronic or logic module, apparatus, device, or system such as those shown in FIGS. 4A-4D, 8I, and 9I. As such, design structure 1020 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1010 preferably employs and incorporates hardware and/or software modules for synthesizing, translating, or otherwise processing a design/simulation functional equivalent of the components, circuits, devices, or logic structures shown in FIGS. 4A-4D, 6, 8I, and 9I to generate a netlist 1080 which may contain design structures such as design structure 1020. Netlist 1080 may comprise, for example, compiled or otherwise processed data structures representing a list of wires, discrete components, logic gates, control circuits, I/O devices, models, etc. that describes the connections to other elements and circuits in an integrated circuit design. Netlist 1080 may be synthesized using an iterative process in which netlist 1080 is resynthesized one or more times depending on design specifications and parameters for the device. As with other design structure types described herein, netlist 1080 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1010 may include hardware and software modules for processing a variety of input data structure types including netlist 1080. Such data structure types may reside, for example, within library elements 1030 and include a set of commonly used elements, circuits, and devices, including models, layouts, and symbolic representations, for a given manufacturing technology (e.g., different technology nodes, 32 nm, 45 nm, 100 nm, etc.). The data structure types may further include design specifications 1040, characterization data 1050, verification data 1060, design rules 1070, and test data files 1085 which may include input test patterns, output test results, and other testing information. Design process 1010 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 1010 without deviating from the scope and spirit of the invention. Design process 1010 may also include modules for performing standard circuit design processes such as timing analysis, verification, design rule checking, place and route operations, etc.

Design process 1010 employs and incorporates logic and physical design tools such as HDL compilers and simulation model build tools to process design structure 1020 together with some or all of the depicted supporting data structures along with any additional mechanical design or data (if applicable), to generate a second design structure 1090. Design structure 1090 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 1020, design structure 1090 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 4A-4D, 6, 8I, and 9I. In one embodiment, design structure 1090 may comprise a compiled, executable HDL simulation model that functionally simulates the devices shown in FIGS. 4A-4D, 6, 8I, and 9I.

Design structure 1090 may also employ a data format used for the exchange of layout data of integrated circuits and/or symbolic data format (e.g. information stored in a GDSII (GDS2), GL1, OASIS, map files, or any other suitable format for storing such design data structures). Design structure 1090 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 4A-4D, 6, 8I, and 9I. Design structure 1090 may then proceed to a stage 1095 where, for example, design structure 1090: proceeds to tapeout, is released to manufacturing, is released to a mask house, is sent to another design house, is sent back to the customer, etc.

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

What is claimed is:

1. An integrated electronic apparatus, having a substantially planar surface, the apparatus comprising:
- a first conductive electrode region having a length greater than its width and an axis aligned with the length, wherein the first conductive electrode region is a plated trench wall of a first trench aligned parallel to the length, and wherein the width is about 5 nanometers;
- a second conductive electrode region having an edge oriented at an angle to the axis of the first conductive electrode region, wherein the second conductive electrode region is in a second trench perpendicular to the first trench;
- an insulator region providing a lateral separation distance between an end of the first conductive electrode region and the edge of the second conductive electrode region, the insulator region comprising at least part of an insulator film and the lateral separation distance is based on the thickness of the insulator film, wherein the thickness of the insulator film ranges from 3 to 20 nanometers, and wherein the insulator film is in the second trench underneath the second conductive electrode region; and
- a layer of a patterned storage material that at least partially covers the first conductive electrode region and the second conductive electrode region.

2. The apparatus of claim 1, wherein the width of the first conductive electrode region is based on a thickness of a plating on the plated trench wall.

3. The apparatus of claim 2, wherein the first conductive electrode region is one of titanium, tungsten, titanium nitride, and titanium aluminum nitride.

4. The apparatus of claim 1, wherein the storage material is a phase change material.

5. The apparatus of claim 1, wherein the angle is substantially a right angle.

* * * * *